(12) United States Patent
Utz et al.

(10) Patent No.: US 6,951,827 B2
(45) Date of Patent: Oct. 4, 2005

(54) CONTROLLING SURFACE CHEMISTRY ON SOLID SUBSTRATES

(75) Inventors: Arthur L. Utz, Boxborough, MA (US); Ludo B. F. Juurlink, Leiden (NL)

(73) Assignee: Tufts University, Boston, MA (US)

( * ) Notice: Subject to any disclaimer, the term of this patent is extended or adjusted under 35 U.S.C. 154(b) by 50 days.

(21) Appl. No.: 10/221,247

(22) PCT Filed: Mar. 15, 2001

(86) PCT No.: PCT/US01/08327

§ 371 (c)(1),
(2), (4) Date: Mar. 3, 2003

(87) PCT Pub. No.: WO01/68271

PCT Pub. Date: Sep. 20, 2001

(65) Prior Publication Data

US 2004/0124348 A1 Jul. 1, 2004

Related U.S. Application Data

(60) Provisional application No. 60/189,604, filed on Mar. 15, 2000.

(51) Int. Cl.⁷ .............................................. H01L 21/31
(52) U.S. Cl. ........................ 438/765; 438/707; 438/714
(58) Field of Search ................................ 438/765, 706, 438/707, 710, 711, 714, 718, 719, 733

(56) References Cited

U.S. PATENT DOCUMENTS

| | | | |
|---|---|---|---|
| 4,260,649 A | 4/1981 | Dension et al. | |
| 4,386,274 A | 5/1983 | Altshuler | |
| 4,687,539 A | 8/1987 | Burns et al. | |
| 4,828,874 A | 5/1989 | Hiraoka et al. | |
| 4,839,196 A | 6/1989 | Itoh | |
| 5,205,870 A | 4/1993 | Sato et al. | |
| 5,360,764 A | * 11/1994 | Celotta et al. | ............... 427/596 |
| 5,527,731 A | * 6/1996 | Yamamoto et al. | ......... 438/711 |
| 6,183,817 B1 | 2/2001 | Gersonde | |

OTHER PUBLICATIONS

Juurlink et al., "Controlling Surface Chemistry with Light: Spatially Resolved Deposition of Rovibrational–State–Selected Molecules," J. Phys. Chem.

Juurlink et al., "Eigenstate–Resolved Studies of Gas–Surface Reactivity: $CH_4$ $(v_3)$ Dissociation on Ni(100)," Phy. Rev. Ltrs., 83:868–871 (Jul. 26, 1999).

McCabe et al., "A molecular beam apparatus for eigenstate–resolved studies of gas–surface reactivity," Rev. of Sci. Instr., 71:1–12 (Jan. 2000).

* cited by examiner

Primary Examiner—Kevin M. Picardat
(74) Attorney, Agent, or Firm—Fish & Richardson, P.C.

(57) ABSTRACT

By exposing precursor molecules traveling in a molecular beam to a narrow bandwidth laser beam (hu) tuned to a vibrational resonance frequency of the molecules and aimed orthogonal to the molecular beam (FIG. 6A), only those molecules having velocity (va) along trajectory (A) orthogonal to the laser beam are excited, becoming several orders of magnitude more reactive, affording a high degree of control over precise locations of reactions of molecules. Controlling a reaction on a surface of a solid substrate, includes; (a) obtaining a precursor molecule that includes (or can be reacted to form) species to be reacted with the substrate; (b) creating a molecular beam (eg., supersonic) that includes the precursor molecule; (c) vibrationally exciting the molecule with the laser beam tuned to a vibrational resonance frequency of the molecule; and (d) causing the exciting molecule to impinge on the substrate, enabling reactions (deposition, etching ... ) of the species with the substrate.

32 Claims, 10 Drawing Sheets

CONTROLLING SURFACE CHEMISTRY ON SOLID SUBSTRATES

This application claims the benefit of Provisional Application No. 60/189,604, filed Mar. 15, 2000.

STATEMENT AS TO FEDERALLY SPONSORED RESEARCH

This invention was made with Government support under grant number CHE-9703392, awarded by the National Science Foundation. The Government has certain rights in this invention.

FIELD OF THE INVENTION

The invention relates to methods for controlling surface chemistry on solid substrates.

BACKGROUND OF THE INVENTION

Chemical vapor deposition and submicron etching techniques are widely applied, for example, in the manufacture of semiconductors and chips. Existing methods typically afford limited control over the collimation of the deposited or etching materials impinging on the substrate, resulting, for example, in overly broad reaction zones or lower than desired aspect ratios (i.e., coating or etching depth divided by width). There is considerable interest in developing spatially resolved deposition processes.

Gas-surface reactions are multistep processes that involve complex interactions between a solid substrate and gas-phase reactants. The nature of these interactions can vary with the system. While many reactions depend sensitively on the geometric and electronic structure of the substrate, others appear to depend more strongly on the extent of excitation in the gas-phase reagent. For example, the direct dissociative chemisorption of methane, which is rate limiting in the industrial steam reforming reaction, is an example of the latter case.

Dissociative chemisorption is affected by a number of parameters that complicate experimental efforts to unravel the reaction mechanism. Translational, vibrational, and rotational energy in the gas-phase reagent, surface temperature, surface structure, and the orientation and impact parameter of the incident gas-phase molecule can all affect the outcome of the gas-surface encounter.

SUMMARY OF THE INVENTION

The invention is based on the discovery that by exposing precursor molecules traveling in a molecular beam to a narrow bandwidth laser beam tuned to a vibrational resonance frequency of the precursor molecules and aimed orthogonal to the molecular beam, only those molecules having a trajectory orthogonal to the laser beam are excited and become several orders of magnitude more reactive, which affords a high degree of control over the location of reactions of the precursor molecules. One possible result is the precise deposition of the precursor molecule, or a part thereof, on a substrate.

In general, one embodiment of the invention features a method for controlling a reaction on a surface of a solid substrate. The method includes the steps of (a) obtaining a precursor molecule that includes (or can be react to form) a species to be reacted with the solid substrate; (b) creating a molecular beam (e.g., a supersonic molecular beam) that includes the precursor molecule; (c) vibrationally exciting the precursor molecule with a narrow bandwidth laser beam tuned to a vibrational resonance frequency of the precursor molecule; and (d) causing the excited precursor molecule to impinge on a surface of the solid substrate, thereby enabling a reaction of the species with the solid substrate.

The precursor molecule can be, for example, a molecule that can be represented as $XH_n$ or $XH_nY_m$, where X can be C, Si, Ge, F, Cl, N, P, O, As, or Ga; n can be 1, 2, 3, or 4, Y can be any element (e.g., C, Si, Ge, F, Cl, N, P, O, As, Ga, or other elements), and m can be any integer (e.g., 1, 2, 3, 4, or more). Thus, examples of precursor molecules include $CH_4$, $SiH_4$, $GeH_4$, HF, HCl, $NH_3$, $PH_3$, $H_2O$, $AsH_3$, $GaH_3$, and $SiH_2Cl_2$. $F_2$ or $Cl_2$ can also be suitable precursor molecules. The precursor molecules can, in some cases, be chosen to selectively etch only regions of the surface of the substrate possessing a specified chemical identity such as a metallic surface or a surface bearing certain functional groups.

The solid substrate can, for example, be a metal or a semiconductor.

The reaction can be, for example, the dissociative or non-dissociative chemisorption of one or more species to the solid substrate when or after the precursor molecule impinges on the surface, including bonding of the whole or of one, two, or more fragments of the precursor molecule to the substrate, such as $-CH_3$ and $-H$ to a substrate when methane is used as a precursor molecule.

In some cases, the reaction can result in the etching of the solid substrate after the precursor molecule impinges on the surface. The reaction can also or alternatively include a rearrangement of atoms in the precursor molecule after the precursor molecule impinges on the surface.

The laser beam can be aimed orthogonal to the mean trajectory of precursor molecules in the molecular beam. The laser beam can be contained within an optical standing wave cavity, in which case the optical alignment of the laser can result in reaction along a series of parallel lines after the precursor molecule impinges upon the surface.

Another embodiment of the invention features a method for preparing a three-dimensional pattern on a substrate. The method includes the steps of (a) obtaining a precursor molecule that includes a species to be reacted with the substrate; (b) creating a molecular beam that includes the precursor molecule; (c) vibrationally exciting the precursor molecule with a narrow bandwidth laser beam tuned to a vibrational resonance frequency of the precursor molecule; (d) causing the excited precursor molecule to impinge on a surface of the substrate, thereby depositing the species on the substrate; and (e) repeating steps (a)–(d) at least once (e.g., once, twice, five, ten, a hundred, a thousand, or more times) with the same or a different precursor molecule, where the excited precursor molecules deposit the species on the same or a different portion of a surface of a substrate in each repetition of steps (a)–(d), thereby creating a three-dimensional pattern on the substrate.

Still another embodiment of the invention features a method for preparing a three-dimensional pattern etched into a surface of a substrate. The method includes the steps of (a) obtaining a precursor molecule including an etchant species to be reacted with the substrate; (b) creating a molecular beam that includes the precursor molecule; (c) vibrationally exciting the precursor molecule with a narrow bandwidth laser beam tuned to a vibrational resonance frequency of the precursor molecule; (d) causing the excited precursor molecule to impinge on a surface of the substrate, thereby etching the substrate; and (e) repeating steps (a)–(d) at least once with the same or a different precursor molecule, where the excited precursor molecules impinge on the same or a different portion of a surface of a substrate in each repetition of steps (a)–(d).

The invention provides several advantages. For example, the new methods provide a highly collimated source of reactive precursor molecules. Moreover, the use of energetic gas-phase molecules reduces the need for high substrate surface temperatures. High surface temperatures can lead to undesirable effects such as surface or interlayer diffusion or unwanted side reactions.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

DETAILED DESCRIPTION

Figure 1:
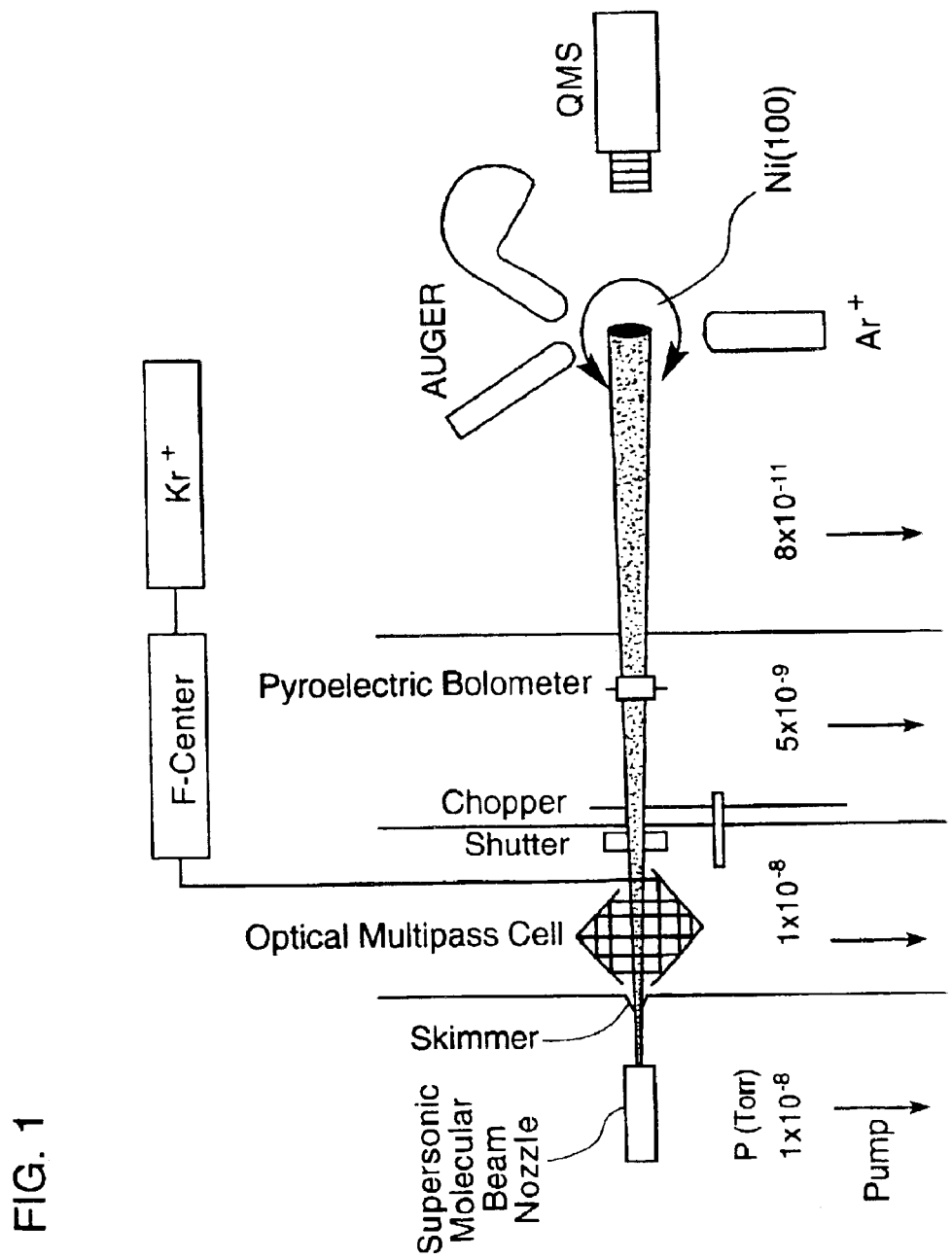
FIG. 1 is a schematic illustration of an apparatus used to deposit a species of a precursor molecule, such as carbon, on a substrate, such as nickel crystal.

The invention is based on the discovery that reactions occurring at the surface of a solid substrate can be controlled by exciting precursor molecules traveling in a molecular beam impinging upon the solid substrate by exposing the precursor molecules to a narrow bandwidth laser tuned to a vibrational resonance frequency of the molecules, and aimed orthogonal to the trajectory of the molecules. Such vibrational excitation increases reactivity of the molecules by up to 1600-fold or more, relative to non-excited molecules. The new methods allow for a narrow region of laser-enhanced reaction on a substrate surface even where the entire surface of the substrate is exposed to the molecular beam. Excitation conditions can be adapted, for example, to allow the precursor molecules to react in a single stripe, or a set of equally spaced parallel stripes on the surface of the substrate.

Substrates and Molecular Beams

Suitable substrates for the new methods can include metal and semiconductor substrates. Metals such as nickel, platinum, palladium, rhodium, ruthenium, iridium, tungsten, and other transition and main group metals, as well as alloys of various metals (e.g., stainless steel), can serve as substrates. Examples of deposition systems thus include growth of patterned metal carbide structures through the selective deposition of carbon from a methane precursor molecule. Growth of nickel carbide is described below, but it should be understood that the new methods can be applied to the preparation of other carbides such as tungsten carbide. Selective deposition of nitrogen from ammonia can form metal nitride structures. Selective oxide growth could proceed from the use of water as a precursor. Metal carbide and nitrides are known to have desirable materials properties including their hardness. Metal oxides exhibit unique catalytic behavior.

Semiconductor substrates include silicon (Si), gallium arsenide (GaAs), germanium (Ge), diamond (C), and other elemental and compound semiconductors (e.g., SiGe). Semiconductor substrates are candidates for patterned deposition and etching. Examples of deposition processes include growth of carbide and nitride insulating layers on silicon using methane or ammonia precursors, respectively, and the heteroepitaxial growth of layered semiconductor materials using silane, disilane, or germane as precursors for silicon or germanium deposition. The new method can also facilitate the three-dimensional growth of compound semiconductors like gallium arsenide. Use of energetic methane molecules can facilitate the patterned heteroepitaxial growth of single crystal diamond films on nickel substrates.

Suitable precursor molecules to form the molecular beam components include, for example, molecular gases such as methane, silane, germane, ammonia, arsane, water, or other molecules capable of absorbing infrared light. The reactive molecules can be diluted in a carrier gas such as hydrogen or an inert gas such as helium. Larger and more complex molecules can also exhibit enhanced reactivity and can be amenable to the new methods, but their greater structural complexity is likely to decrease the difference in reactivity between laser-excited and non-excited molecules.

The molecule chosen to be excited will depend on the species desired for deposition on the substrate. Thus, for example, a methane beam can be used for deposition of carbon at substrate temperatures higher than about 473 K, or methyl groups at lower substrate temperatures. Similarly, a beam of silane can be used for the deposition of silicon, ammonia for the deposition of nitrogen, germane for the deposition of germanium, gallane for the deposition of gallium, and arsane for the deposition of arsenic. Beams of fluorine gas or hydrogen fluoride can be used, for example, for etching silicon substrate, rather than depositing material.

The various vibrational frequencies for each of the bonds in most small molecules have been determined, reported in the literature, and are well known. For those that have not been previously determined, it is a routine matter to calculate the vibrational frequency.

Use of the New Methods for Coating Substrates

In general, a supersonic molecular beam can be expanded from a heated nozzle source into an ultrahigh vacuum (UHV) surface analysis chamber such as that described in McCabe et al., *Review of Scientific Instruments,* 71(1):1–12 (2000). The substrate to be contacted (e.g., coated) is housed within the UHV chamber, together with analytical devices such as a hemispherical electron energy analyzer for Auger electron spectroscopy measurements or a quadrupole mass spectrometer located on the molecular beam axis for time-of-flight analysis of the molecular beam. A schematic illustration of a suitable apparatus appears in FIG. 1. The apparatus' design ideally allows excitation of a significant fraction of the incident molecular beam into a single rovibrational eigenstate using infrared laser radiation.

Light from a single-mode color center laser is then tuned to an absorption feature (e.g., a vibrational frequency) of one of the molecules of the molecular beam. Focusing the light into, for example, a four-mirror multipass cell housed in the first differential pumping chamber can increase the number of orthogonal passes that the light makes through the molecular beam, and thus can increase excitation efficiency. The orthogonal excitation geometry is preferably designed to prevent the velocity spread along the molecular beam flight axis from projecting onto the laser's propagation direction, as we believe that such a projection would Doppler shift most molecules in the molecular beam out of resonance with the infrared light.

The dissociative chemisorption of the molecules of the molecular beam can be quantitated by detecting deposition or reaction on the surface, for example, with Auger electron spectroscopy, particularly if species physisorbed on the surface can be desorbed from the substrate's surface.

This method produces a highly collimated source of energized molecules capable of chemically bonding to, or reacting with, a solid substrate. The high collimation of the source can sharpen features in deposited or etched features on the substrate. The enhanced reactivity of the laser-excited molecules can decrease the need to activate the reaction with high surface temperatures. Adjusting optical alignment provides additional control over the extent of collimation and the spatial distribution of surface reaction products.

Factors Affecting the Results of the New Methods

Selective excitation of a portion of the Doppler-broadened absorption profile of molecules in the molecular beam is the basis for the collimation and spatial localization that we observe. The Doppler shift in absorption frequency that molecules experience when they move relative to the laser's propagation direction allows us to excite only those molecules that are moving orthogonally to the laser light Reaction rate increases exponentially with the kinetic energy (and therefore speed) of molecules impinging on the surface. Higher molecular speeds allow deposition or etching to proceed more quickly. A competition between transit-time broadening and flight time from the laser excitation region to the surface results in the molecular beam speed having little or no effect on the collimation and spatial localization achieved with this method. There is a balance between beam speed and concentration of precursor molecules. For example, beams that contain more methane (relative to hydrogen) travel more slowly, but contain more carbon; the optimum beam speed/carbon load is apparently achieved with about 2% methane, although the entire range investigated from 0.25% to 100% methane yields good results.

Higher nozzle temperatures also increase the beam speed, and thus reaction rate. Temperatures in the range of 295 K to 500 K gave good results for methane. If the nozzle temperature is higher than about 700 K, the beam speed will be too high, however, and even non-excited molecules will fall apart (and thus be highly reactive) upon collision with the substrate, decreasing the effectiveness of the new methods.

The distance between the irradiation site and the substrate is of little relevance for collisional broadening once you get beyond a distance equal to about 20 times the diameter of the gas nozzle; since the gas nozzle is only about $\frac{1}{1000}$", this is hardly any restriction at all. In general, however, the closer the excitation source to the substrate, the better the resolution.

Substrate temperature can be varied over a fairly wide range (e.g., 80 K to 475 K), although, in the case of methane carried by hydrogen gas, low substrate temperatures allow saturation of the surface with hydrogen, preventing deposition of carbon.]

We have identified six optical broadening mechanisms that we believe contribute to the observed linewidth of the absorption transition in our experiments, namely transit-time broadening, collisional broadening, Doppler broadening, lifetime broadening, saturation broadening, and laser bandwidth. The principal effect of the broadening mechanisms is to increase the range of frequencies that can be resonant with the optical transition. Additionally, beam speed, excitation geometry, and alignment of multipass cell mirrors can contribute to spatial blurring of deposited or etched features. These mechanisms are discussed below.

If the broadened absorption profile is identical for all molecules in the sample, the broadening is homogeneous. When light overlaps with any portion of a homogeneously broadened absorption profile, all molecules in the beam have an equal probability for excitation. Lifetime (natural), transit-time, saturation (power), and collisional broadening are all homogeneous broadening mechanisms.

If the broadened profile arises from an ensemble average, i.e. different subsets of molecules in the sample absorb different frequencies of light, then the broadening is inhomogeneous. When narrow bandwidth light excites different parts of an inhomogeneously broadened absorption feature, distinct subsets of molecules in the sample are excited.

Doppler broadening is an inhomogeneous broadening mechanism. Our ability to excite a portion of the inhomogeneously broadened Doppler profile of methane in the molecular beam is the basis for the localized deposition we observe. Although inhomogeneous broadening makes spatially resolved deposition possible, laser bandwidth and homogeneous broadening mechanisms determine the ultimate dimensions of the localized deposition region.

In our experiments, transit-time broadening is believed to be the dominant homogeneous broadening mechanism for methane molecules in the molecular beam. We have quantified the extent of saturation in our optical pumping experiments and calculate that saturation broadening increases the natural linewidth by less than a factor of two. Methane molecules in the seeded supersonic molecular beam travel at velocities up to 2800 m/s. The orthogonal excitation geometry coupled with methane's high speed limits the laser-molecule interaction time. Table I summarizes transit times for three different molecular beams passing through our 1.4 mm diameter laser spot.

TABLE I

| Beam | $V_\parallel$, m/s | $E_{kin}$, kJ/mol | $\Delta v_{tt}$, MHz |
|---|---|---|---|
| 100% $CH_4$ | 1000 | 8.0 | 1.1 |
| 22% $CH_4/H_2$ | 1729 | 23.9 | 1.9 |
| 2% $CH_4/H_2$ | 2345 | 44.0 | 2.5 |

For molecules passing through plane wave radiation, the molecules' flight time alone determines the transit-time broadened linewidth. When the laser is not perfectly collimated, the constant-phase fronts of the radiation field are no longer planar, and it is the molecule's flight time through a constant phase region of space that becomes important. Following Demtröder (*Laser Spectroscopy Basic Concepts and Instrumentation*, $2^{nd}$ ed., Springer-Verlag, Berlin, 1996), we have $$\Delta v_{tt} \approx \frac{0.4 \, v}{w} \left[ 1 + \left( \frac{\pi w^2}{R\lambda} \right)^2 \right] \quad (1)$$

where $\Delta v_{tt}$ is the full-width at half peak maximum (FWHM) due to transit-time broadening, v is the molecular speed, w is the laser beam waist (as a halfwidth), $\lambda$ is the radiation wavelength, and R is the radius of curvature of the constant phase fronts in the laser-molecule interaction volume. We gently focus the laser light, and its focal point is located approximately 0.5 m before the multipass cell. Therefore, for our excitation geometry, a beam waist of 0.7 mm, a wavelength of $\lambda \approx 3.3$ μm, and a molecular speed of 2345 m/s, we calculate a homogeneous linewidth (FWHM) of 2.5 MHz. Demtröder points out that for molecules flying through a laser field with a Gaussian intensity profile; transit-time broadening leads to a Gaussian absorption profile with FWHM=$\Delta v_{tt}$. Table I summarizes calculated values of $\Delta v_{tt}$ for the three molecular beams used in this study.

While elastic and inelastic collisions during optical excitation can broaden an absorption feature, we do not expect collisional broadening to be important in our experiments. The collision frequency in a supersonic expansion drops rapidly with distance from the nozzle source. For expansion conditions similar to the ones described herein, it is believed that over 99% of the collisions in the supersonic expansion occur within the first 20 nozzle diameters downstream from the nozzle source. Beyond that distance, no more than one additional collision remains for the average molecule. Since the multipass cell is located more than 1200 nozzle diameters downstream, collisions during optical excitation are not significant source of line broadening.

Doppler broadening is believed to be the most important inhomogeneous broadening mechanism in the new laser excitation step. Molecules in the molecular beam have a range of transverse velocities due to their divergence from a 25 μm nozzle orifice to a 1.1 cm diameter image at the Ni(100) crystal. Those molecules traveling along the beam axis have zero transverse velocity, while those traveling toward the edge of the beam image have a maximum transverse speed. The maximum transverse velocity component of a particular molecular beam, $v_{\perp,max}$ depends on a molecule's maximum displacement from the beam axis upon impact with the surface, $\Delta r_{max}$, and the flight time from nozzle to surface, t. Flight time is the quotient of the velocity component parallel to the flight axis divided by the nozzle-surface distance; 1. Therefore, $$v_{\perp,max} = \frac{\Delta r_{max}}{t} = \frac{v_\parallel \Delta r_{max}}{l} \quad (2)$$

Table II lists $\Delta r_{max}$ and the maximum transverse speeds for beams impinging on both the 2-mm diameter pyroelectric bolometer absorption detector and the 10-mm diameter Ni(100) crystal. The range of transverse speeds present in each beam leads to Doppler broadening. Since the bolometer intercepts a smaller solid angle of the beam than does the Ni(100) crystal, molecules impinging on the edge of the detector have a smaller transverse velocity component than do those molecules impinging on the edge of the Ni(100) substrate.

TABLE II

| Beam | $V_\parallel$, m/s | $E_{kin}$, kJ/mol | l, m | t, μsec | $\Delta r_{max}$, m | $v_{\perp,max}$, m/s | $\Delta v_{max}$, MHz |
|---|---|---|---|---|---|---|---|
| @ Pyroelectric Detector | | | | | | | |
| 100% $CH_4$ | 1000 | 8.0 | 0.2141 | 214 | 0.0010 | 4.7 | 1.4 |
| 22% $CH_4/H_2$ | 1729 | 23.9 | 0.2141 | 124 | 0.0010 | 8.1 | 2.4 |
| 2% $CH_4/H_2$ | 2345 | 44.0 | 0.2141 | 91 | 0.0010 | 10.9 | 3.3 |
| @ Ni(100) Surface | | | | | | | |
| 100% $CH_4$ | 1000 | 8.0 | 0.4039 | 404 | 0.0050 | 12.4 | 3.8 |
| 22% $CH_4/H_2$ | 1729 | 23.9 | 0.4039 | 234 | 0.0050 | 21 | 6.5 |
| 2% $CH_4/H_2$ | 2345 | 44.0 | 0.4039 | 172 | 0.0050 | 29 | 8.8 |

Examining the basis for Doppler broadening reveals the origin of the spatially resolved deposition we observe. Infrared light and the molecular beam propagate in the horizontal plane and are mutually orthogonal, so transverse velocity components in the horizontal plane project onto the laser's propagation axis. The resulting Doppler shift in absorption frequency is given by Eq. 3 (Demtröder).

$$\Delta v = v_0 \frac{v_\perp}{c} \quad (3)$$

Here, $\Delta v$ is the Doppler shift associated with molecules moving with transverse velocity $v_\perp$ in the horizontal plane, $v_0$ is the unperturbed peak absorption frequency for the transition, and c is the speed of light. Eq. 3 clearly shows that molecules with different velocity components in the horizontal plane have different Doppler frequency shifts. Table II shows the maximum Doppler shift expected for the $v_3$ R(1) fundamental transition at 3038 $cm^{-1}$. Since both parallel and antiparallel transverse velocities are possible in the multipass cell, the FWHM for the Doppler broadened profile is twice the maximum frequency shift. Table II shows that the Doppler shift for molecules impinging on the Ni sample is much greater than the laser linewidth, or the homogeneous linewidth of molecules in the molecular beam.

The role of laser bandwidth in these experiments depends on its magnitude relative to the homogeneous absorption linewidth. Two limiting cases illustrate this point. In the first, the molecules' homogeneous absorption linewidth is very narrow relative to the 1 MHz laser bandwidth. When the laser frequency, with its instantaneous linewidth of ≈100 kHz, jitters within the 1 MHz frequency envelope, different transverse velocity subgroups of molecules will be excited in the beam, each for a fraction of the total irradiation time. This situation results in the time-averaged dissociation probability at a particular point on the substrate differing significantly from the true laser-enhanced dissociation probability. In contrast, if the homogeneous absorption profile is broader than the laser bandwidth, frequency jitter does not alter the identity of the molecules excited. All molecules whose Doppler shifted absorption profile is resonant with the 1 MHz laser bandwidth envelope will be resonant with the instantaneous frequency of the laser radiation for the full irradiation time. Since the transit-time broadened homogeneous linewidth of all beams in our study exceeds the laser bandwidth of 1 MHz, the latter case holds.

Predicted Deposition Pattern: In our state-resolved dissociative chemisorption experiments, the Fabry-Perot reference étalon cavity length is adjusted so that its transmission maximum coincides with $v_0$, the unperturbed absorption frequency for methane molecules traveling along the center of the molecular beam flight axis ($v_\perp$=0). When the laser frequency is locked to the Fabry-Perot transmission fringe, only those molecules whose homogeneously broadened absorption profile overlaps with the laser frequency can absorb light. Those molecules whose absorption peak is Doppler shifted by significantly more than the halfwidth of the homogeneous absorption profile will not be excited. Thus, infrared excitation selects a subset of methane molecules whose transverse velocity along the laser propagation direction is nearly zero. Since there are essentially no direction-changing collisions in the molecular beam following infrared absorption, selective excitation of molecules with a specific transverse velocity component maps onto a specific region of laser-enhanced deposition on the surface, as shown in FIG. 4.

Figure 4:
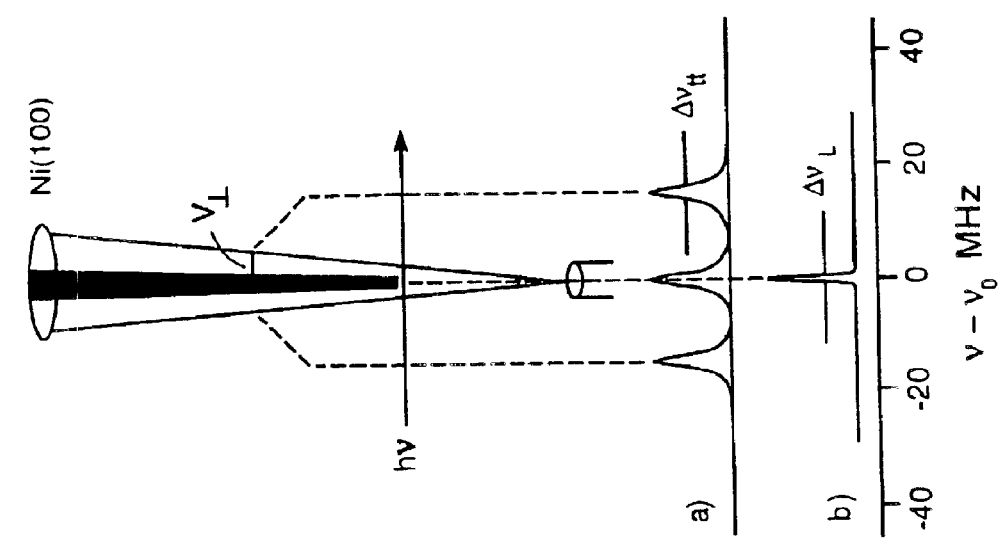
FIG. 4 is a plot of excitation of an inhomogeneous absorption profile with narrow bandwidth radiation (a), compared with a plot of absorption profile for a system in which laser light at frequency $v_0$ and bandwidth $\Delta v_L$ is resonant only with those molecules whose transverse velocity component is nearly zero.

In FIG. 4, three different subsets of molecules in the molecular beam, each having the same homogeneous linewidth, $\Delta v$, are illustrated. Their peak absorption frequency is Doppler shifted due to their differing transverse velocities relative to the laser propagation direction, $v_\perp$. Laser light at frequency $v_0$ and bandwidth $\Delta v_L$ is resonant only with those molecules whose transverse velocity component is nearly zero. As a result, laser-enhanced carbon deposition on the Ni(100) surface is localized on the crystal center.

One can quantitatively predict the width of the enhanced deposition region observed. FIG. 4 shows that those molecules whose Doppler-shifted homogeneous absorption profiles overlap with the laser linewidth can absorb light and react with enhanced probability on the Ni(100) surface. Since the transit-time broadened absorption profile for reactive molecules significantly exceeds the laser linewidth in these experiments, the homogeneous linewidth, coupled with the transverse speed and nozzle-surface flight time for molecules in the molecular beam determines the physical dimensions of the enhanced deposition region.

Figure 3A:
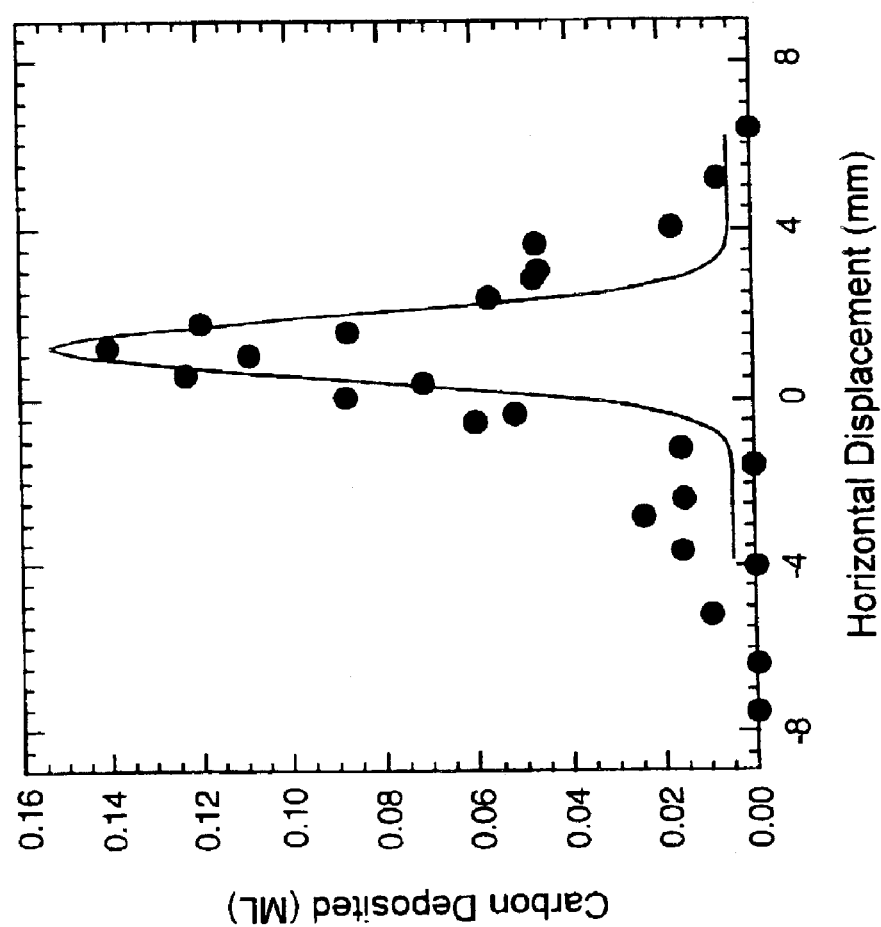
FIGS. 3A and 3B are plots of carbon coverage as a function of horizontal displacement from crystal center, corresponding to a methane/hydrogen beam with and without laser excitation, respectively.

We begin our quantitative analysis by focusing on the data in FIG. 3A, for which the molecular speed along the flow axis is 2345 m/s. The transit-time broadened homogeneous linewidth for the $CH_4$ in the beam is 2.5 MHz (i.e., full peak width and half peak maximum, or "FWHM"). Methane molecules whose absorption profile is Doppler shifted by half this linewidth would still absorb light from a laser fixed at frequency $v_0$, albeit with about half the probability. We substitute a 1.3 MHz halfwidth into Eq. 3 and solve for $v_\perp$=4.3 m/s. (Molecules traveling with a transverse velocity of ±4.3 m/s along the laser's propagation direction would have their peak absorption frequency shifted by 1.3 MHz from $v_0$.) The flight time for molecules to travel from the nozzle to the surface determines how far a molecule with a given transverse velocity moves away from the molecular beam axis. Table II shows that the flight time for $CH_4$ in the 2345 m/s beam is 172 μs. The transverse displacement from the beam center is 0.7 mm for $CH_4$ molecules with $v_\perp$=4.3 m/s. The optical path for infrared light in our multipass cell simultaneously excites molecules moving to the right and left of the crystal center. Laser enhanced deposition occurs in a region±0.7 mm from crystal center for a FWHM of 1.4 mm. Qualitative inspection of FIG. 3 shows that this estimate is consistent with the experimental data.

The model of the laser-enhanced deposition area can be improved by properly accounting for the various line shapes in our experiment. Transit-time broadening leads to a Gaussian absorption profile. Each $CH_4$ molecule in the molecular beam can therefore be treated as having a homogeneous Gaussian absorption profile with FWHM=2.5 MHz. The infrared laser light has a bandwidth of 1 MHz, FWHM. The transverse-velocity-dependent absorption of light at frequency $v_0$ can be calculated by convoluting the laser bandwidth with the Doppler-shifted homogeneous linewidth for all molecules impinging on the crystal face. This transverse-velocity-dependent profile can be multiplied by the nozzle-to-surface flight time results to predict the spatial distribution of carbon deposition. This spatial distribution can then be convoluted with the 1-mm diameter circular spot size of our Auger electron spectrometer to reproduce the experimentally measured carbon deposition map. Finally, the known dissociation probability (Juurlink et al., *Phys. Rev. Lett.*, 83:868–871, 1999) resulting from the molecules in the molecular beam that are not excited by the laser can be added. These molecules result in a small, but measurable deposition of 0.005 ML of carbon across the entire face of the crystal. The results of this convolution appear as the solid line passing through the laser-on data in FIG. 3A. The prediction is in excellent agreement with the data. Our predictions of deposition region widths for both laser-on and laser-off experiments contain no adjustable parameters.

Molecular motion in the vertical direction is not subject to the same limitations. Since transverse velocity components in the vertical plane do not project on the laser's propagation axis, molecular motion in the vertical direction does not result in Doppler detuning. We have mapped carbon deposition in the vertical direction, and find uniform laser-enhanced deposition over the entire 1.0 cm diameter crystal.

Figure 5:
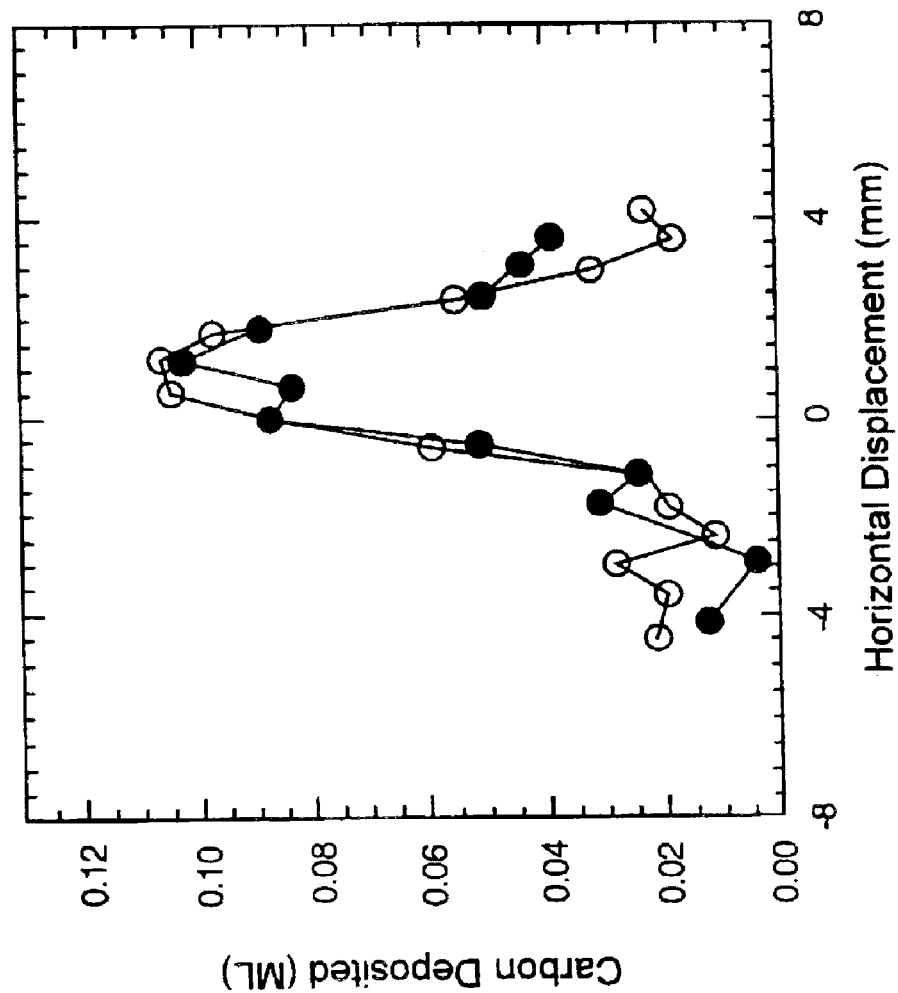
FIG. 5 is a plot of carbon coverage versus horizontal displacement from crystal center for laser-excited molecular beams with two different incident velocities. Open symbols result from a 2345 m/s $CH_4$ molecular beam, while the solid symbols result from a 1730 m/s $CH_4$ beam.

Role of Molecular-Beam Speed: FIG. 5 shows carbon deposition maps for two laser-enhanced deposition experiments performed at different molecular beam speeds. The open symbols show carbon deposition from a 2345 m/s $CH_4$ molecular beam, while the closed symbols show carbon deposition for a 1730 m/s CH beam. The two regions have identical widths.

Offsetting contributions from the transit-time broadened homogeneous linewidth and the molecular time of flight time account for the two molecular beams producing laser-enhanced deposition areas with the same dimensions. Eq. 1 shows that the transit-time broadened linewidth depends linearly on molecular beam speed along the flight axis. Since transit-time broadening dominates all other homogeneous broadening mechanisms by several orders of magnitude in these experiments, the homogeneous linewidth of methane molecules in the beam is directly proportional to molecular beam speed. Molecules whose transverse velocity exceeds some critical value are Doppler shifted out of resonance with the laser frequency at $v_0$ and absorb significantly less or no infrared light. Eq. 3 can be rearranged to calculate the transverse velocity needed to Doppler shift the homogeneous linewidth by its half its FWHM.

$$v_\perp = \frac{c\Delta v_{tt}}{2v_0} \approx \frac{0.2\ vc}{v_0 w}\left[1+\left(\frac{\pi w^2}{R\lambda}\right)^2\right] \quad (4)$$

The full-width of the laser-enhanced desorption region, $\Delta x$, is twice the product of $v_\perp$ and the nozzle-surface flight time, $t=1/v$, where 1 is the nozzle-surface distance.

$$\Delta x \approx \frac{0.4\ vc}{v_0 w}\left[1+\left(\frac{\pi w^2}{R\lambda}\right)^2\right]\frac{1}{v} = \frac{0.4\ lc}{v_0 w}\left[1+\left(\frac{\pi w^2}{R\lambda}\right)^2\right] \quad (5)$$

Eq. 5 shows that the horizontal dimension of the laser-enhanced deposition region is independent of molecular beam velocity, within the limit where the homogeneous linewidth is a linear function of molecular beam speed. This independence arises from the offsetting effects of a greater transverse velocity but shorter flight time for molecules in the faster molecular beam.

Role of Excitation Geometry: The results presented in FIGS. 3A and B depend sensitively on the alignment of the optical multipass cell and on the alignment of the laser with the molecular beam. In this section, we begin by examining the effect of laser alignment with the molecular beam, then consider multipass cell alignment, and conclude with an experimental measurement that confirms the model of the process.

Figure 6:
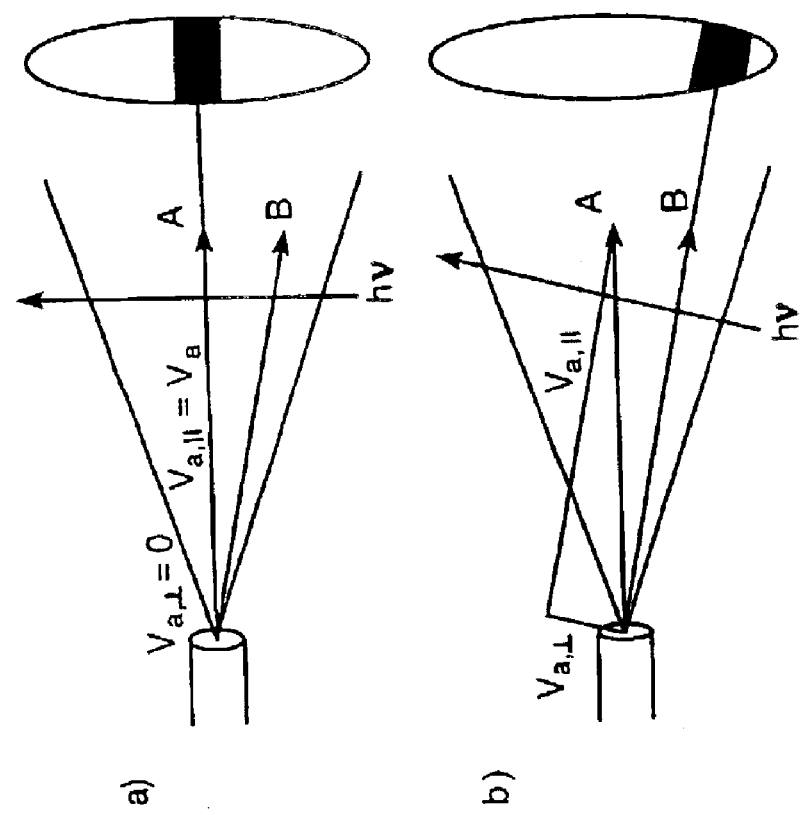
FIGS. 6A and 6B are detailed views of the laser-molecular beam interaction region (6a: laser orthogonal to molecular path A; 6b: laser orthogonal to molecules moving along path B).

When the infrared laser is tuned near $v_0$, only those molecules moving along paths that are very nearly orthogonal to the laser absorb infrared light. FIGS. 6a and b show the laser-molecular beam interaction region. The angular divergence of the molecular beam is exaggerated to highlight geometric effects. In FIG. 6a, the laser propagation direction is orthogonal to the molecular beam axis. Molecules traveling along that axis (path A) have a zero component of velocity along the laser's propagation direction, so they absorb light and react with higher probability on the Ni(100) substrate. Molecules traveling along path B are not resonant with the laser because the projection of their flow velocity onto the laser propagation direction Doppler shifts their absorption peak out of resonance with the laser frequency $v_0$. FIG. 6b shows the situation when the laser is not aligned perpendicularly to the molecular beam axis. Now molecules traveling along path B are moving orthogonally to the laser propagation direction and can absorb light; molecules traveling along path A have a non-zero projection of their velocity along the laser propagation direction and are Doppler shifted out of resonance. Subtle changes in the direction of laser propagation alter the path of laser-excited molecules and affect their point of impact on the Ni(100) surface. The small displacement of the laser-enhanced deposition region in FIG. 3A from the crystal center is a manifestation of this effect.

The homogeneous linewidth of molecules in the beam does allow molecules with small transverse velocities to remain in resonance with infrared light at $v_0$, and molecules traveling toward or away from the incident laser's propagation direction are equally likely to be excited by light in the multipass cell. A well-aligned multipass cell results in up to 16 parallel crossings of infrared light through the molecular beam. Half of the passes are parallel with the laser's propagation direction upon entering the chamber, while the other half are exactly antiparallel.

Figure 7:
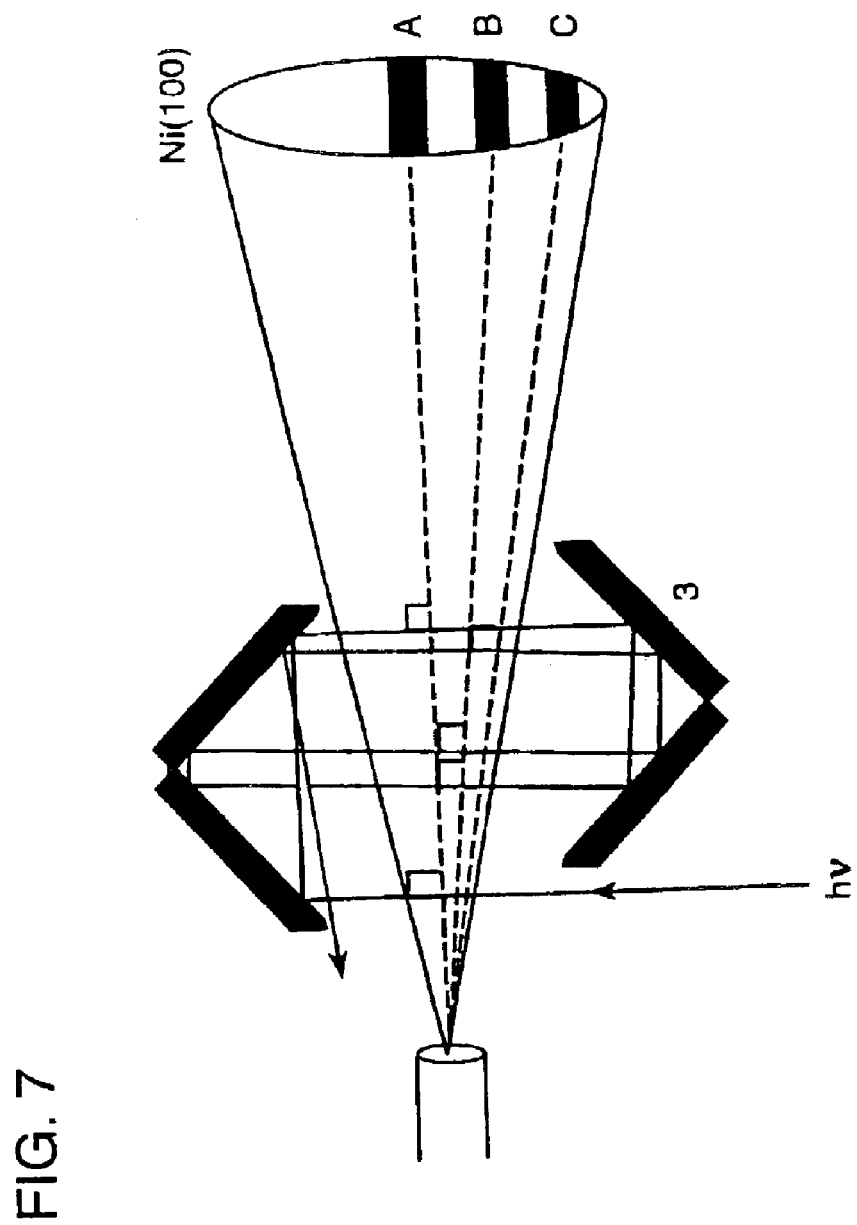
FIG. 7 is a detailed view of a multipass cell in which mirror 3 is slightly misaligned.

Misalignment of one mirror in the multipass cell can result in two or more laser-enhanced deposition areas appearing on the Ni(100) substrate. As indicated by FIG. 7, molecules emerge from the molecular beam nozzle and pass through the multipass cell on their way to the Ni(100) substrate. Mirror 3 in the multipass cell is mounted on a kinematic mount and was tilted 0.40° from its optimal position to illustrate the effect of multipass cell misalignment. We recorded the extent of rotation of the adjustment screw on the mount and used the pitch of the screw and the pivot distance on the optical mount to calculate the 0.40° tilt angle. Light enters the multipass cell and reflects specularly from each of the four mirrors. The first two passes (incident light plus first reflection from mirror 2) are orthogonal to the molecular beam flow axis. They selectively excite molecules moving along path A. The misalignment of mirror 3 rotates the next two parallel laser-beam crossings into an orientation that is orthogonal to path B. The fifth pass is further rotated in the same direction by mirror 3 and is orthogonal to path C. Enhanced deposition on the Ni(100) surface occurs where molecular paths A, B, and C impinge on the substrate. For such a misalignment, paths A, B, and C differ by a constant angular displacement. Therefore, a set of discrete laser-molecular beam intersection angles gives rise to an equal number of discrete propagation directions for the laser excited molecules. Alignment errors of 0.1 or less can affect the geometry of the deposition area.

Figure 8:
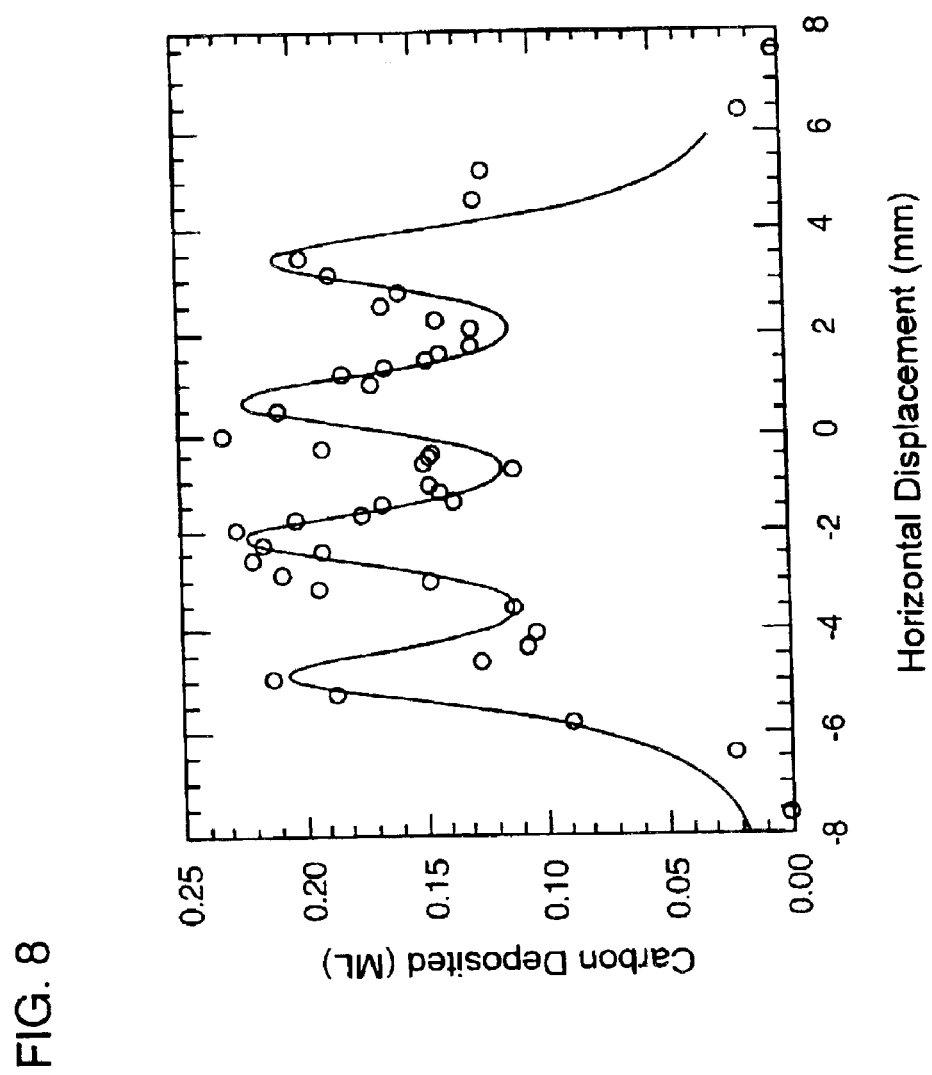
FIG. 8 is a plot of carbon deposition resulting from a misaligned multipass cell.

FIG. 8 shows the effects of a misaligned multipass cell, and the resulting carbon deposition map. The data were collected with a 2% $CH_4/H_2$ mixture expanding from a 400 K nozzle source. The higher nozzle temperature increases the speed of the beam, and we calculate a transit-time broadened homogeneous linewidth of 3 MHz. Since laser excitation occurs only for those molecules traveling perpendicularly to the laser direction, we infer that the four paths leading to laser-enhanced deposition on the surface differ by the measured 0.40° angular offset of the laser passes in the multipass cell. The spatial distribution for a single pass is calculated as detailed above, and then sum spatial distributions for four molecular paths are separated by 0.40° to obtain the solid line passing through the data in FIG. 8. Once again, the new model, with no adjustable parameters, is an accurate predictor of the spatial distribution of carbon deposited on the surface.

The data in FIG. 8 serve as useful diagnostics for the new excitation scheme. The model described in the preceding paragraph assumes that peak carbon coverage is identical in all four regions. Since the total flux of methane is constant across the surface, the excellent agreement of the model and the data in FIG. 8 suggests that infrared laser excitation efficiency remains constant for at least eight sequential laser-molecular beam crossings. This finding confirms the expectation that in a large excess of photons relative to absorbers in the beam, that photon number does not decrease significantly with increasing molecular beam crossings. It also indicates that the focal conditions for the infrared light keep the light well collimated during its travel through the multipass cell.

Applications of the New Methods

The new methods provide a general approach to depositing gas-phase precursors onto a solid substrate. The principal requirements of the new methods are that the precursors absorb infrared light and that the laser-excited precursors differ in reactivity from non-laser excited precursors.

The spatial resolution of existing chemical vapor deposition and molecular beam epitaxy processes can be compromised by the range of angles at which precursor molecules impinge on the substrate surface. The high collimation of the reactive precursor source resulting from the new methods can provide improved film conformality in multilayer deposition processes and can permit higher aspect ratio structures to be deposited or etched.

The new methods can be useful for chemically modifying or etching the surface of semiconducting substrates. Heterostructures can be formed by depositing silicon from a silane precursor or germanium from a germane precursor onto silicon, germanium, or compound semiconductor surfaces. Dopants, including nitrogen from ammonia, or arsenic from arsine can also be deposited using the new methods. The new methods can also be used to grow compound semiconductors such as gallium arsenide by alternately depositing laser-excited gallium- and arsenic-containing precursors.

Semiconductors can also be etched, for example, using laser-excited hydrogen fluoride, hydrogen chloride, or other molecular etchants.

Use of the New Methods with an Optical Buildup Cavity

The new methods can be adapted to permit submicron lithography or etching using molecular precursors. An optical buildup cavity can be used to excite molecules in a molecular beam, as described, for example, in Boraas et al. (*J. Phys. Chem.* 89:4774, 1985). Such a cavity also creates a standing wave. For our experiments, the periodicity of the wave would be half the wavelength of the infrared light, or about 1.6 $\mu$m. When a collimated molecular beam passes through the buildup cavity, those molecules passing through the nodes in the standing wave field would not be excited, while those passing through the peak intensity areas would be excited and react with enhanced probability on the substrate.

In contrast to the situation for an expanding molecular beam, where the nozzle location and Doppler shifts alone define the spatial distribution of excited molecules impinging on the surface, the standing wave field places an additional constraint on the spatial distribution of molecules that are excited. Molecules must not only have a small transverse velocity component to be resonant with the excitation light source; they must pass through a portion of the standing wave where the optical field is large. The spatial patterning imprinted on the methane sample by standing wave excitation will be degraded only by transverse flight between the buildup cavity and the surface. If the optical buildup cavity is located close to the surface (e.g. 1 cm), broadening due to transverse flight outwards off the flight axis can result in a halfwidth of less than 700 nm. Since this source of broadening is less than the periodicity of the standing wave pattern in the buildup cavity, spatial resolution dominated by the dimensions of the standing wave in the cavity can be achieved.

Figure 9:
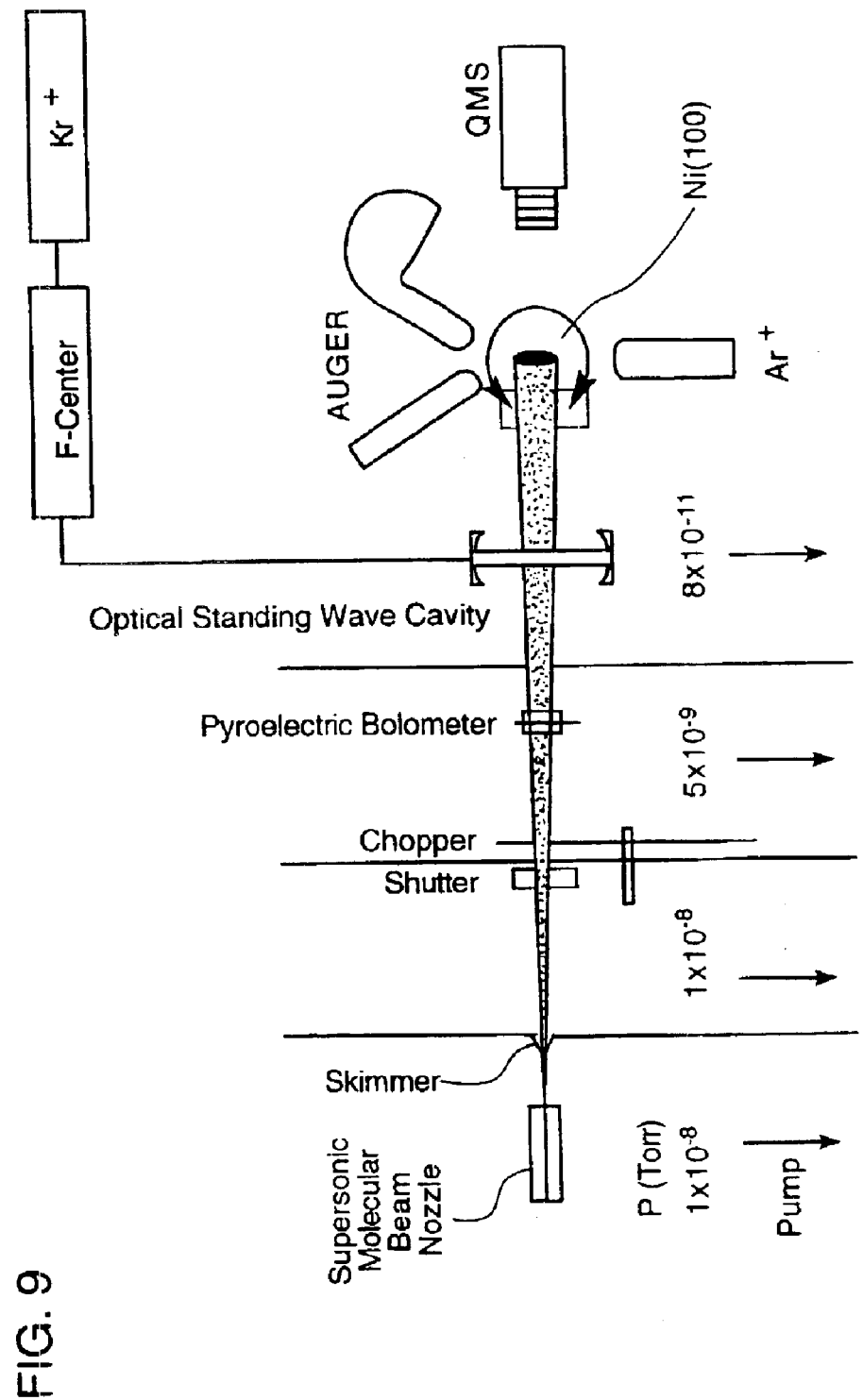
FIG. 9 is a schematic illustration of an apparatus used to deposit a species of a precursor molecule, such as carbon, on a substrate, such as nickel crystal, including an optical standing wave cavity.

The standing wave cavity is general and can be applied to any of the systems described herein, including both deposition and etching, provided that the buildup cavity is made of a material that is compatible with the precursor molecules, particularly where the precursors include corrosive gases such as hydrogen fluoride (HF) or hydrogen chloride (HCl). A schematic diagram of an apparatus including an optical standing wave cavity is shown in FIG. 9. Suitable optical standing wave cavities can be prepared by adapting commercially available devices such as those sold by Newport Research Corporation (Irvine, Calif.).

The invention is further described in the following examples, which do not limit the scope of the invention described in the claims.

EXAMPLES

Example 1 provides an illustration of an application of the new methods to the preparation of a 1 mm wide stripe of carbon coated on a nickel surface using a methane-doped hydrogen gas molecular beam. Example 2 is an example of the use of the new methods to etch a silicon substrate with hydrogen fluoride.

Example 1

Spatially Resolved Deposition of Laser-Excited Methane Molecules onto a Nickel Substrate Experimental Procedure Supersonic molecular beams of methane (i.e., pure or seeded in hydrogen at a concentration of 0.25% or higher), were expanded from a heated nozzle source and triply differentially pumped prior to entering an ultrahigh vacuum (UHV) surface analysis chamber as described in McCabe et al. (*Rev. Sci. Instrum.*, 7111:42–53, 2000). The UHV chamber housed a 1-cm diameter Ni(100) single crystal oriented to within 0.1° of the (100) plane, an electron gun and hemispherical electron energy analyzer for Auger electron spectroscopy measurements, a sputter gun for crystal cleaning, and a quadrupole mass spectrometer located on the molecular beam axis for time-of-flight analysis of the molecular beam. A schematic illustration of the apparatus appears in FIG. 1. The apparatus' design allows excitation of a significant fraction of the incident molecular beam into a single rovibrational eigenstate using infrared laser radiation.

The enhanced dissociative chemisorption probability of these state-selected molecules was then quantified. Infrared light from a continuous wave, single-mode color center laser was focused into a four-mirror multipass cell housed in the first differential pumping chamber, to make up to 16 orthogonal passes through the molecular beam. The orthogonal excitation geometry was designed to prevent the velocity spread along the molecular beam flight axis from projecting onto the laser's propagation direction, as we believe that such a projection would Doppler shift most molecules in the molecular beam out of resonance with the infrared light. A room temperature pyroelectric bolometer housed in the second differential pumping stage was used to provide a direct measure of infrared absorption. The detector was mounted on a linear motion feedthrough, such that it could be moved into the molecular beam path for absorption measurements or retracted to allow the beam to pass freely into the surface analysis chamber. The 2-mm diameter bolometer intercepted a solid angle of the molecular beam centered on the Ni(100) crystal, but, because the detector's solid angle is much smaller than that subtended by the crystal, observation of laser-excited molecules impinging on the bolometer was thought to guarantee that laser-excited molecules would fall on the Ni(100) surface when the bolometer was retracted from the beam path.

Figure 2:
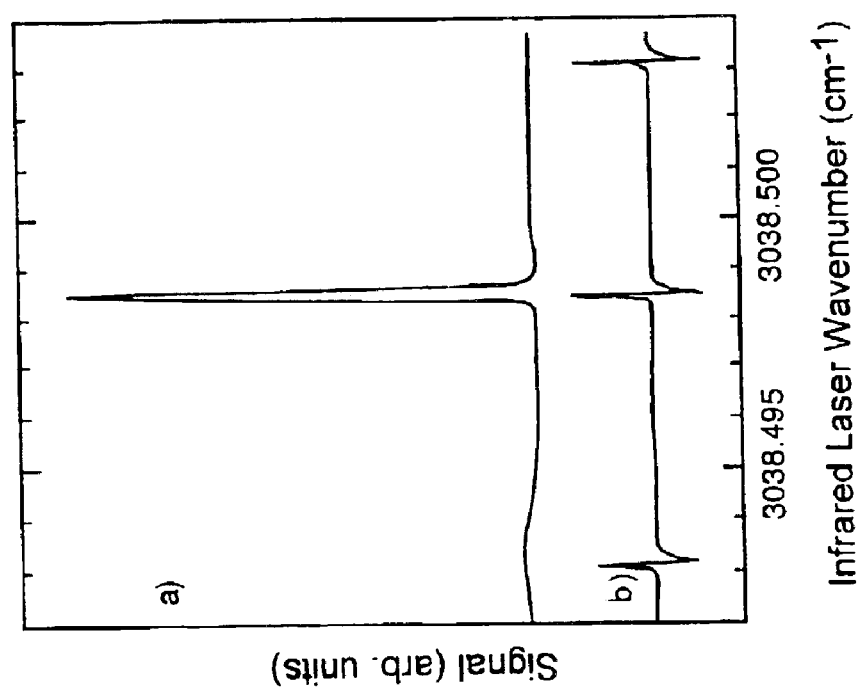
FIG. 2 is a plot of infrared absorption spectra of methane in a supersonic molecular beam (trace a: infrared absorption as measured by a pyroelectric bolometer; trace b: derivative signal for light transmitted through a Fabry-Perot etalon).

FIG. 2 is a plot of the absorption signal measured with the bolometer while scanning the infrared laser over the R(1) transition to the $v_3$, v=1, J=2 eigenstate. Up to 16% of all methane molecules in the incident beam were excited.

To ensure that the infrared light remained in resonance with the methane absorption throughout the experiment, the laser frequency was locked into the transmission fringe of a temperature stabilized, vacuum-jacketed Fabry-Perot étalon with a computer-controlled servo loop. Characterization of the frequency stabilization scheme demonstrated that the laser frequency drifted by no more than 1 MHz during an experiment. The width of the transmission fringe and an estimate of the Fabry-Perot cavity's resolution places an upper limit on the laser bandwidth of 1 MHz, consistent with the manufacturer's specifications. The instantaneous linewidth of the color center laser was typically much less than 1 MHz, but high-frequency acoustic modes of the laser cavity introduced frequency jitter that increased the laser's effective bandwidth.

The dissociative chemisorption of $CH_4$ was quantified by detecting carbon deposition on the surface with Auger electron spectroscopy. Methane physisorbed on the surface desorbed promptly from our 475K Ni(100) surface, and carbon dissolution into the bulk did not occur with a significant rate until higher temperatures were reached. We integrated the Auger electron peaks for carbon (272 eV) and Ni (848 eV) and took the ratio of peak integrals as a measure of relative carbon coverage. The known 0.50 ML carbon coverage resulting from the self-limiting saturation coverage of $C_2H_4$ on Ni(100) was used to calibrate our carbon measurements. An extended exposure of a clean surface to the electron beam verified that the 20-nA electron beam did not result in additional carbon deposition during our measurement. We adjusted the focal properties of the electron gun and hemispherical analyzer so that the imaging area of the hemispherical analyzer would define the spatial resolution of the spectrometer.

We measured the spatial resolution of the Auger electron spectrometer by exposing the surface to a high kinetic energy beam of methane while positioning the Ni surface so that the edge of the molecular beam image fell near the crystal center. This procedure resulted in an abrupt boundary where surface carbon coverage changed from 0.00 ML to 0.15 ML. We measured carbon coverage as a function of crystal position relative to the hemispherical analyzer focal point, and deduced that the hemisphere imaged a 1.0 mm diameter spot on the surface. Monitoring the Ni Auger signal as the Ni(100) crystal edge passed through the detection area confirmed this measure of spatial resolution.

The measurements described in this study were maps of carbon deposition collected following methane doses with and without laser excitation. Varying the position of the crystal during the dose allowed us to characterize the full image of the molecular beam when it passed through the largest aperture in our sliding beam valve. Under those conditions, we calculated the molecular beam diameter at the position of the crystal to be 1.1 cm. We generated the carbon deposition maps by making individual measurements of carbon coverage at a series of points on the crystal surface. We then translated the crystal in front of the hemispherical analyzer to vary the point characterized, and we ensured that the sample-to-spectrometer working distance remained fixed for all measurements.

Results

Figure 3B:
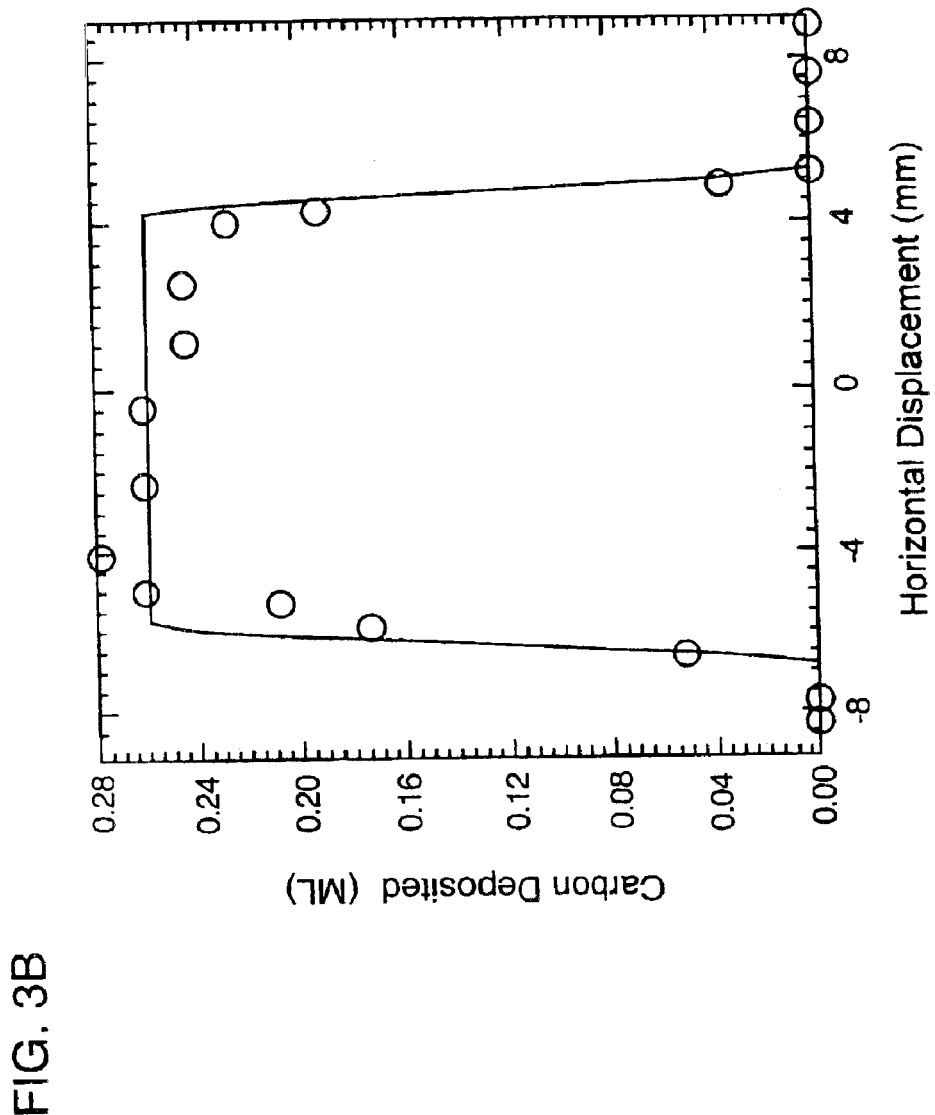

FIGS. 3A and 3B are plots of carbon coverage as a function of horizontal displacement from the crystal center, corresponding to experiments in which a molecular beam of 2% methane in hydrogen gas was expanded from a 295 K nozzle with and without laser-excitation, respectively. Time-of-flight measurements revealed the beam's translational energy to be 44.0 kJ/mol and its-energy width $\Delta E/E$ to be $\leq 5\%$. In the laser-excitation experiment, the laser beam intersected the molecular beam at 90° to the flow axis and 30 cm upstream from the nickel surface. 12% of the methane molecules in the beam were found to have been excited to the J=2 rotational level of the $\nu_3$ antisymmetric C—H stretching eigenstate via the R(1) transition at 3038.4985 $cm^{-1}$. To ensure that dissociative chemisorption probability remained constant during the exposure, dose times for the laser-enhanced deposition were adjusted to result in carbon coverage $\leq 0.14$ ML.

FIGS. 3A and B illustrates a striking localization of laser-enhanced deposition observed in these experiments. The open symbols indicate the location of carbon deposition without laser excitation and the spatial extent of the molecular beam. The solid symbols indicate the spatial distribution of laser-enhanced deposition. When we deconvoluted the spot size of our Auger electron spectrometer, the region of laser-enhanced deposition was found to be nearly a factor of five narrower than the molecular beam image.

The spatial distribution of carbon deposition for the laser-off (i.e., non-excited) experiment agreed quantitatively with our predictions of molecular beam diameter and our measurement of Auger electron sampling area. Since the Ni(100) crystal intercepts a very small solid angle centered on the molecular beam flight axis, methane flux was believed to be constant over the crystal face. The relatively constant carbon coverage measured for the laser-off experiment was consistent with that expectation and indicated that our technique for quantifying carbon coverage as a function of position on the crystal did not exhibit a significant bias. Collimating apertures along the molecular beam path defined the molecular beam's size (1.1 cm diameter) at the crystal surface. A convolution of this beam diameter with the 1.0 mm Auger electron spectrometer spot size appeared as a solid line passing through the laser-off data in FIG. 3.

Example 2

Spatially Resolved Etching of a Semiconductor Surface by Laser-Excited Hydrogen Fluoride Molecules A supersonic molecular beam of hydrogen fluoride (HF) diluted in an inert carrier gas expands from a nozzle source and is triply differentially pumped prior to entering an ultrahigh vacuum chamber containing a silicon substrate, as described in McCabe et al., (Rev. Sci. Instrum., 71(1):42–53, 2000). Infrared light crosses the molecular beam and excites HF molecules to a single rotational level of the first excited vibrational state. An orthogonal excitation geometry similar to that used in Example 1 allows a significant fraction of the HF molecules to be excited into a single excited rovibrational eigenstate using infrared laser radiation.

To quantify the enhanced reactivity of the laser excited molecules, a mass spectrometer in the chamber monitors the number of HF molecules scattered non-reactively from the silicon surface. The laser light irradiating the molecular beam is modulated, and changes in the scattered HF signal are monitored with the mass spectrometer. Laser-excited molecules that are more reactive than non-laser excited molecules will react with the surface and not scatter. Thus, a decrease in the magnitude of the scattered HF signal that coincides with the modulation of the infrared light will reveal the enhanced reactivity of the laser-excited HF molecules.

HF etching of a silicon surface proceeds via sequential fluoridation of surface-bound silicon atoms. X-ray photoelectron spectroscopy (XPS) detects the localized deposition of fluorine atoms at the site of reaction and will spatially map the etching reaction.

Masks with abrupt edges are placed in front of the silicon substrate to test the collimation of the etching source. If only a highly collimated beam of HF etchant molecules passes through the mask and reacts at or very near its impact point at the surface, etched features will have steep vertical walls, which can be detected with atomic force microscopy or scanning tunneling microscopy.

OTHER EMBODIMENTS

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

We claim:

1. A method for controlling a reaction on a surface of a solid substrate, the method comprising:
   obtaining a precursor molecule comprising a species to be reacted with the solid substrate;
   creating a molecular beam comprising the precursor molecule;
   vibrationally exciting the precursor molecule with a narrow bandwidth laser beam tuned to a vibrational resonance frequency of the precursor molecule; and
   causing the excited precursor molecule to impinge on a surface of the solid substrate, thereby enabling a reaction of the species with the solid substrate.

2. The method of claim 1, wherein the molecular beam is a supersonic molecular beam.

3. The method of claim 1, wherein the precursor molecule is selected from the group consisting of $XH_n$ and $XH_nY_m$, where X is an element selected from the group consisting of C, Si, Ge, F, Cl, N, P, O, As, and Ga; n is an integer from 1 to 4 inclusive; m is an integer; and Y is another element.

4. The method of claim 1, wherein the solid substrate is a metal.

5. The method of claim 1, wherein the solid substrate is a semi-conductor.

6. The method of claim 1, wherein the reaction is the dissociative chemisorption of one or more species to the solid substrate after the precursor molecule impinges on the surface.

7. The method of claim 1, wherein the reaction is the dissociative chemisorption of one or more species to the solid substrate when the precursor molecule impinges on the surface.

8. The method of claim 1, wherein the reaction is the chemisorption of the precursor molecule to the solid substrate.

9. The method of claim 1, wherein the reaction results in etching of the solid substrate after the precursor molecule impinges on the surface.

10. The method of claim 1, wherein the reaction is a rearrangement of atoms in the precursor molecule after the precursor molecule impinges on the surface.

11. The method of claim 1, wherein the laser beam is aimed orthogonal to the mean trajectory of precursor molecules in the molecular beam.

12. The method of claim 1, wherein the precursor molecules are chosen to selectively etch only regions of the surface of the substrate possessing a specified chemical identity.

13. The method of claim 1, wherein the laser beam is contained within an optical standing wave cavity.

14. The method of claim 13, wherein the optical alignment of the laser results in a series of parallel lines after the precursor molecule impinges upon the surface.

15. The method of claim 1, wherein only those precursor molecules in the molecular beam that are moving orthogonally to a direction of propagation of the laser beam are vibrationally excited.

16. The method of claim 1, wherein the laser beam is an infrared laser beam.

17. The method of claim 1, wherein the precursor molecule is methane, silane, germane, ammonia, arsane, gallane, water, fluorine, or hydrogen fluoride.

18. The method of claim 1, wherein the reaction comprises bonding of one or more fragments of the precursor molecule to the substrate.

19. A method for preparing a three-dimensional pattern on a substrate, the method comprising
   (a) obtaining a precursor molecule comprising a species to be reacted with the substrate;
   (b) creating a molecular beam comprising the precursor molecule;
   (c) vibrationally exciting the precursor molecule with a narrow bandwidth laser beam tuned to a vibrational resonance frequency of the precursor molecule;
   (d) causing the excited precursor molecule to impinge on a surface of the substrate, thereby depositing the species on the substrate; and
   (e) repeating steps (a)–(d) at least once with the same or a different precursor molecule, wherein the excited precursor molecules deposit the species on the same or a different portion of a surface of a substrate in each repetition of steps (a)–(d), thereby creating a three-dimensional pattern on the substrate.

20. The method of claim 19, wherein only those precursor molecules in the molecular beam that are moving orthogonally to a direction of propagation of the laser beam are vibrationally excited.

21. The method of claim 19, wherein the laser beam is an infrared laser beam.

22. The method of claim 19, wherein the precursor molecule is selected from the group consisting of $XH_n$ and $XH_nY_m$, where X is an element selected from the group consisting of C, Si, Ge, F, Cl, N, P, O, As, and Ga; n is an integer from 1 to 4 inclusive; m is an integer; and Y is another element.

23. The method of claim 19, wherein the solid substrate is a metal or a semi-conductor.

24. The method of claim 19, wherein the laser beam is aimed orthogonal to the mean trajectory of precursor molecules in the molecular beam.

25. The method of claim 19, wherein the precursor molecule is methane, silane, germane, ammonia, arsane, or gallane.

26. A method for preparing a three-dimensional pattern etched into a surface of a substrate, the method comprising
   (a) obtaining a precursor molecule comprising an etchant species to be reacted with the substrate;
   (b) creating a molecular beam comprising the precursor molecule;
   (c) vibrationally exciting the precursor molecule with a narrow bandwidth laser beam tuned to a vibrational resonance frequency of the precursor molecule;
   (d) causing the excited precursor molecule to impinge on a surface of the substrate, thereby etching the substrate; and (e) repeating steps (a)–(d) at least once with the same or a different precursor molecule, wherein the excited precursor molecules impinge on the same or a different portion of a surface of a substrate in each repetition of steps (a)–(d).

27. A method of claim 26, wherein only those precursor molecules in the molecular beam that are moving orthogonally to a direction of propagation of the laser beam are vibrationally excited.

28. A method of claim 26, wherein the laser beam is an infrared laser beam.

29. The method of claim 26, wherein the precursor molecule is selected from the group consisting of $XH_n$ and $XH_nY_m$, where X is an element selected from the group consisting of C, Si, Ge, F, Cl, N, P, O, As, and Ga; n is an integer from 1 to 4 inclusive; m is an integer; and Y is another element.

30. The method of claim 26, wherein the solid substrate is a metal or a semi-conductor.

31. The method of claim 26, wherein the laser beam is aimed orthogonal to the mean trajectory of precursor molecules in the molecular beam.

32. The method of claim 26, wherein the precursor molecule is fluorine or hydrogen fluoride.

* * * * *